(12) United States Patent
Flynn et al.

(10) Patent No.: US 9,042,181 B2
(45) Date of Patent: May 26, 2015

(54) PERIODIC ERASE OPERATION FOR A NON-VOLATILE MEDIUM

(71) Applicant: Fusion-io, Inc., Salt Lake City, UT (US)

(72) Inventors: David Flynn, Sandy, UT (US); Hairong Sun, Superior, CO (US); Jea Woong Hyun, South Jordan, UT (US); Robert Wood, Niwot, CO (US)

(73) Assignee: SanDisk Technologies, Inc., Plano, TX (US)

( * ) Notice: Subject to any disclaimer, the term of this patent is extended or adjusted under 35 U.S.C. 154(b) by 132 days.

(21) Appl. No.: 13/837,818

(22) Filed: Mar. 15, 2013

(65) Prior Publication Data

US 2014/0269090 A1    Sep. 18, 2014

(51) Int. Cl.
*G11C 11/34* (2006.01)
*G11C 16/14* (2006.01)

(52) U.S. Cl.
CPC ..................... *G11C 16/14* (2013.01)

(58) Field of Classification Search
USPC ............ 365/185.19, 185.24, 185.22, 185.29, 365/185.18, 185.33
See application file for complete search history.

(56) References Cited

U.S. PATENT DOCUMENTS

2010/0067306 A1* 3/2010 Hwang ................... 365/185.19
2012/0239868 A1   9/2012 Ryan et al.
2014/0003156 A1* 1/2014 He ........................... 365/185.22

\* cited by examiner

*Primary Examiner* — Fernando Hidalgo
(74) *Attorney, Agent, or Firm* — Kunzler Law Group, PC

(57) ABSTRACT

An apparatus, system, and method are disclosed for managing erase operations for a data storage medium. A method includes determining whether a use threshold for one or more non-volatile storage cells is satisfied. A method includes performing a default erase operation for the one or more storage cells in response to determining that the use threshold is not satisfied. A method includes performing an extended erase operation for the one or more storage cells in response to determining that the use threshold is satisfied. An extended erase operation may include a greater number of erase pulse iterations than a default erase operation.

25 Claims, 8 Drawing Sheets

PERIODIC ERASE OPERATION FOR A NON-VOLATILE MEDIUM

FIELD

This disclosure relates to managing a non-volatile medium and more particularly to periodically erasing a non-volatile medium.

BACKGROUND

Certain types of non-volatile storage store data in storage cells. To program a storage cell from an erased state to a programmed state (e.g., from a binary one to a binary zero or the like), a controller for the storage cell may apply various electrical fields to a tunnel oxide layer of the storage cell, by applying a program voltage to a floating gate of the storage cell or the like. To erase a storage cell (e.g., from a binary zero to a binary one or the like), the controller may apply another electrical field to the tunnel oxide layer of the storage cell, by applying an erase voltage to the floating gate of the storage cell or the like.

Over time, program/erase cycles may create trapped charges (e.g., electrons) in the tunnel oxide layer. These trapped charges may accumulate and cause a performance or physical degradation of the tunnel oxide layer. This degradation may cause slower erase times for a block of storage cells, may cause storage cells to fail prematurely, or the like.

SUMMARY

Methods are presented for erasing non-volatile storage cells. In one embodiment, a method includes determining whether a use threshold for one or more non-volatile storage cells is satisfied. In another embodiment, a method includes performing a default erase operation for the one or more storage cells in response to determining that the use threshold is not satisfied. In one embodiment, a method includes performing an extended erase operation for the one or more storage cells in response to determining that the use threshold is satisfied, the extended erase operation including a greater number of erase pulse iterations than the default erase operation.

Apparatuses are disclosed for erasing a non-volatile medium. In one embodiment, a status module is configured to monitor a use threshold for a set of storage cells. In another embodiment, an adjustment module is configured to adjust an erase verify voltage level for the set of storage cells in response to the status module determining that the use threshold is satisfied. In one embodiment, an erase module is configured to perform an erase operation for the set of storage cells using the adjusted erase verify voltage level.

In one embodiment, an apparatus includes means for determining whether a degradation threshold for one or more non-volatile storage cells is satisfied. In another embodiment, an apparatus includes means for performing a default erase operation for the one or more storage cells in response to determining that the degradation threshold is not satisfied. In a further embodiment, an apparatus includes means for performing an extended erase operation for the one or more storage cells in response to determining that the degradation threshold is satisfied. In certain embodiments, an extended erase operation includes a smaller voltage differential between erase steps than a default erase operation.

Systems are disclosed for erasing a non-volatile medium. In one embodiment, a system includes a non-volatile recording medium comprising a plurality of erase blocks. In another embodiment, a system includes a storage controller for the non-volatile recording medium. In one embodiment, the storage controller includes a status module configured to determine a use characteristic for each of the erase blocks. In another embodiment, the storage controller includes an adjustment module configured to adjust initial erase voltage levels independently for different erase blocks. In one embodiment, the storage controller includes an erase module configured to perform an extended erase operation for an erase block using an adjusted initial erase voltage level for the erase block from the adjustment module in response to the use characteristic for the erase block satisfying a use threshold.

Computer program products are disclosed for erasing a non-volatile medium. In one embodiment, a computer program product includes a computer readable storage medium storing computer usable program code executable to perform operations for erasing a non-volatile medium. In one embodiment, an operation includes determining that a use threshold of an erase block has been satisfied. In a further embodiment, an operation includes adjusting one or more erase parameters for the erase block, the adjustments selected to recondition storage cells of the erase block. In another embodiment, an operation includes performing an erase operation for the erase block using the adjusted one or more erase parameters.

Reference throughout this specification to features, advantages, or similar language does not imply that all of the features and advantages that may be realized with the present disclosure should be or are in any single embodiment. Rather, language referring to the features and advantages is understood to mean that a specific feature, advantage, or characteristic described in connection with an embodiment is included in at least one embodiment of the present disclosure. Thus, discussion of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize that the disclosure may be practiced without one or more of the specific features or advantages of a particular embodiment. In other instances, additional features and advantages may be recognized in certain embodiments that may not be present in all embodiments of the disclosure.

These features and advantages of the present disclosure will become more fully apparent from the following description and appended claims, or may be learned by the practice of the disclosure as set forth hereinafter.

BRIEF DESCRIPTION OF THE DRAWINGS

In order that the advantages of the disclosure will be readily understood, a more particular description of the disclosure briefly described above will be rendered by reference to specific embodiments that are illustrated in the appended drawings. Understanding that these drawings depict only typical embodiments of the disclosure and are not therefore to be considered to be limiting of its scope, the disclosure will be described and explained with additional specificity and detail through the use of the accompanying drawings, in which.

DETAILED DESCRIPTION

Figure 1A:
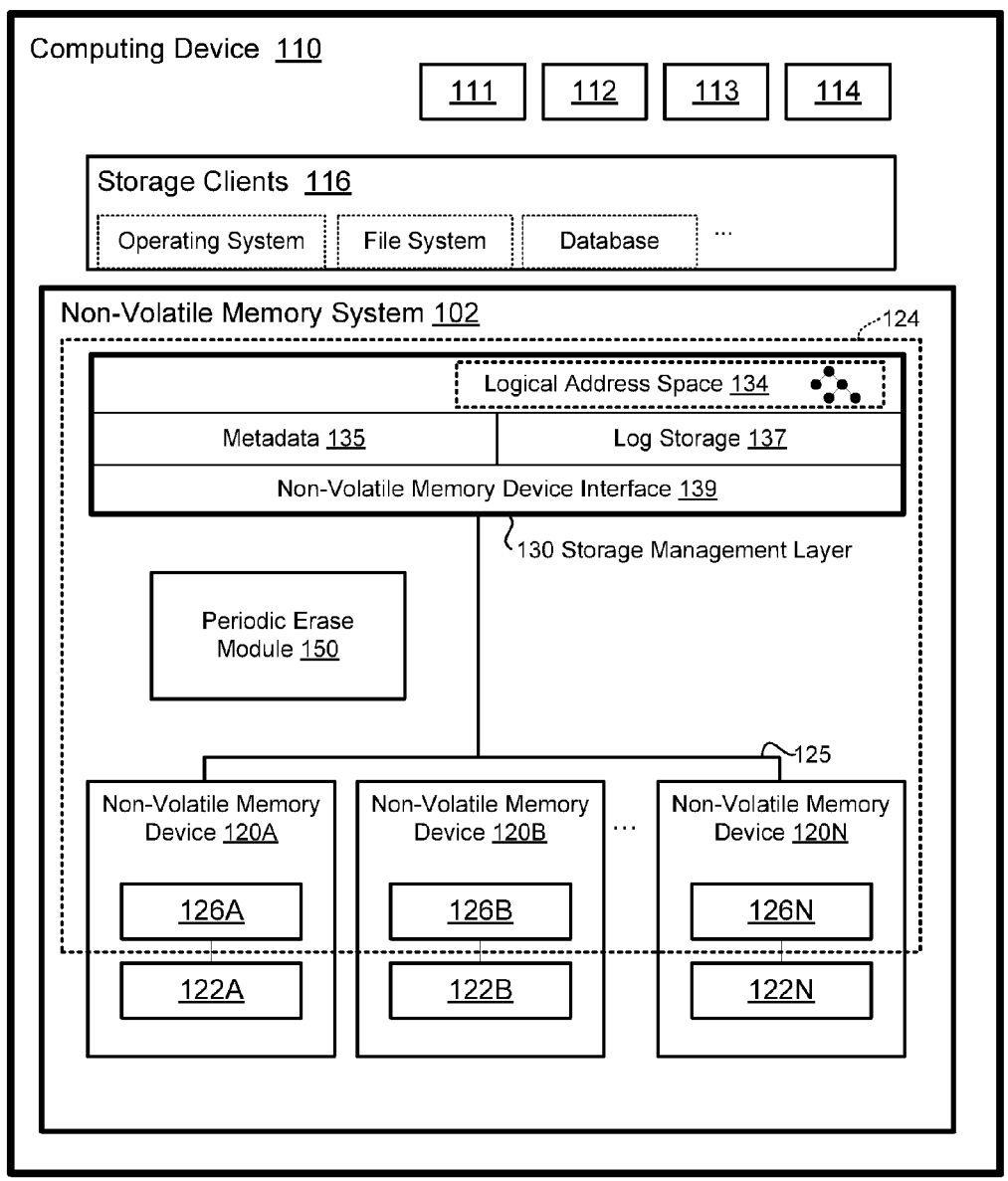
FIG. 1A is a schematic block diagram of one embodiment of a non-volatile memory system comprising a periodic erase module.

Aspects of the present disclosure may be embodied as a system, method or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module" or "system." Furthermore, aspects of the present disclosure may take the form of a computer program product embodied in one or more computer readable storage media having computer readable program code embodied thereon.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different storage devices, and may exist, at least partially, merely as electronic signals on a system or network. Where a module or portions of a module are implemented in software, the software portions are stored on one or more computer readable storage media.

Any combination of one or more computer readable storage media may be utilized. A computer readable storage medium may be, for example, but not limited to, an electronic, magnetic, optical, electromagnetic, infrared, or semiconductor system, apparatus, or device, or any suitable combination of the foregoing.

More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), a digital versatile disc (DVD), a blu-ray disc, an optical storage device, a magnetic tape, a Bernoulli drive, a magnetic disk, a magnetic storage device, a punch card, integrated circuits, other digital processing apparatus memory devices, or any suitable combination of the foregoing, but would not include propagating signals. In the context of this document, a computer readable storage medium may be any tangible medium that can contain, or store a program for use by or in connection with an instruction execution system, apparatus, or device.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, structures, or characteristics of the disclosure may be combined in any suitable manner in one or more embodiments. In the following description, numerous specific details are provided, such as examples of programming, software modules, user selections, network transactions, database queries, database structures, hardware modules, hardware circuits, hardware chips, or the like, to provide a thorough understanding of embodiments of the disclosure. However, the disclosure may be practiced without one or more of the specific details, or with other methods, components, materials, and so forth. In other instances, well-known structures, materials, or operations are not shown or described in detail to avoid obscuring aspects of the disclosure.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

These computer program instructions may also be stored in a computer readable storage medium that can direct a computer, other programmable data processing apparatus, or other devices to function in a particular manner, such that the instructions stored in the computer readable storage medium produce an article of manufacture including instructions which implement the function/act specified in the schematic flowchart diagrams and/or schematic block diagrams block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and computer program products according to various embodiments of the present disclosure. In this regard, each block in the schematic flowchart diagrams and/or schematic block diagrams may represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiment. For instance, an arrow may indicate a waiting or monitoring period of unspecified duration between enumerated steps of the depicted embodiment. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and computer instructions.

The description of elements in each figure may refer to elements of proceeding figures. Like numbers refer to like elements in all figures, including alternate embodiments of like elements.

According to various embodiments, a non-volatile memory controller manages one or more non-volatile memory devices. The non-volatile memory device(s) may comprise memory or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device). Memory units may include, but are not limited to: pages, memory divisions, erase blocks, sectors, blocks, collections or sets of physical storage locations (e.g., logical pages, logical erase blocks, described below), even pages or word lines, odd pages or wordlines, or the like.

The non-volatile memory controller may comprise a storage management layer ("SML"), which may present a logical address space to one or more storage clients. One example of an SML is the Virtual Storage Layer® of Fusion-io, Inc. of Salt Lake City, Utah. Alternatively, each non-volatile memory device may comprise a non-volatile memory media controller, which may present a logical address space to the storage clients. As used herein, a logical address space refers to a logical representation of memory resources. The logical address space may comprise a plurality (e.g., range) of logical addresses. As used herein, a logical address refers to any identifier for referencing a memory resource (e.g., data), including, but not limited to: a logical block address ("LBA"), cylinder/head/sector ("CHS") address, a file name, an object identifier, an inode, a Universally Unique Identifier ("UUID"), a Globally Unique Identifier ("GUID"), a hash code, a signature, an index entry, a range, an extent, or the like.

The SML may maintain metadata, such as a forward index, to map logical addresses of the logical address space to media storage locations on the non-volatile memory device(s). The SML may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML may map logical addresses to physical data resources of any size and/or granularity, which may or may not correspond to the underlying data partitioning scheme of the non-volatile memory device(s). For example, in some embodiments, the non-volatile memory controller is configured to store data within logical memory units that are formed by logically combining a plurality of physical memory units, which may allow the non-volatile memory controller to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (e.g., each non-volatile memory element being accessible in parallel). As used herein, a logical memory division refers to a set of two or more physical memory divisions, each physical memory division on a respective non-volatile memory element in the respective logical memory element.

The logical address space presented by the storage management layer may have a logical capacity, which may correspond to the number of available logical addresses in the logical address space and the size (or granularity) of the data referenced by the logical addresses. For example, the logical capacity of a logical address space comprising 2^32 unique logical addresses, each referencing 2048 bytes (2 KiB) of data may be 2^43 bytes. (As used herein, a kibibyte (KiB) refers to 1024 bytes). In some embodiments, the logical address space may be thinly provisioned. As used herein, a "thinly provisioned" logical address space refers to a logical address space having a logical capacity that exceeds the physical capacity of the underlying non-volatile memory device(s). For example, the storage management layer may present a 64-bit logical address space to the storage clients (e.g., a logical address space referenced by 64-bit logical addresses), which exceeds the physical capacity of the underlying non-volatile memory devices. The large logical address space may allow storage clients to allocate and/or reference contiguous ranges of logical addresses, while reducing the chance of naming conflicts. The storage management layer may leverage the any-to-any mappings between logical addresses and physical storage resources to manage the logical address space independently of the underlying physical storage devices. For example, the storage management layer may add and/or remove physical storage resources seamlessly, as needed, and without changing the logical addresses used by the storage clients.

The non-volatile memory controller may be configured to store data in a contextual format. As used herein, a contextual format refers to a self-describing data format in which persistent contextual metadata is stored with the data on the physical storage media. The persistent contextual metadata provides context for the data it is stored with. In certain embodiments, the persistent contextual metadata uniquely identifies the data that the persistent contextual metadata is stored with. For example, the persistent contextual metadata may uniquely identify a sector of data owned by a storage client from other sectors of data owned by the storage client. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data. The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, or the like), data size and/or range, and the like. The contextual data format may comprise a packet format comprising a data segment and one or more headers. Alternatively, a contextual data format may associate data with context information in other ways (e.g., in a dedicated index on the non-volatile memory media, a memory division index, or the like).

In some embodiments, the contextual data format may allow data context to be determined (and/or reconstructed) based upon the contents of the non-volatile memory media, and independently of other metadata, such as the arbitrary, any-to-any mappings discussed above. Since the media location of data is independent of the logical address of the data, it may be inefficient (or impossible) to determine the context of data based solely upon the media location or media address of the data. Storing data in a contextual format on the non-volatile memory media may allow data context to be determined without reference to other metadata. For example, the contextual data format may allow the metadata to be reconstructed based only upon the contents of the non-volatile memory media (e.g., reconstruct the any-to-any mappings between logical addresses and media locations).

In some embodiments, the non-volatile memory controller may be configured to store data on one or more asymmetric, write-once media, such as solid-state storage media. As used herein, a "write once" storage medium refers to a storage medium that is reinitialized (e.g., erased) each time new data is written or programmed thereon. As used herein, an "asymmetric" storage medium refers to a storage medium having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media). The memory media may be partitioned into memory divisions that can be erased as a group (e.g., erase blocks) in order to, inter alia, account for the asymmetric properties of the media. As such, modifying a single data segment in-place may require erasing the entire erase block comprising the data, and rewriting the modified data to the erase block, along with the original, unchanged data. This may result in inefficient "write amplification," which may excessively wear the media. Therefore, in some embodiments, the non-volatile memory controller may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

The non-volatile memory controller may comprise one or more processes that operate outside of the regular path for servicing of storage operations (e.g., the "path" for performing a storage operation and/or servicing a storage request). As used herein, the "path for servicing a storage request" or "path for servicing a storage operation" (e.g., also referred to as the "critical path") refers to a series of processing operations needed to service the storage operation or request, such as a read, write, modify, or the like. The path for servicing a storage request may comprise receiving the request from a storage client, identifying the logical addresses of the request, performing one or more storage operations on non-volatile memory media, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller comprises a groomer, which is configured to reclaim memory divisions (e.g., erase blocks) for reuse. The write out-of-place paradigm implemented by the non-volatile memory controller may result in obsolete or invalid data remaining on the non-volatile memory media. For example, overwriting data X with data Y may result in storing Y on a new memory division (e.g., rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media may accumulate a significant amount of invalid data. A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller may be further configured to store data in a log format. As described above, a log format refers to a data format that defines an ordered sequence of storage operations performed on a non-volatile memory media. In some embodiments, the log format comprises storing data in a pre-determined sequence of media addresses of the non-volatile memory media (e.g., within sequential pages and/or erase blocks of the media). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller may maintain a current append point at a media address of the non-volatile memory device. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller may identify the "next" available memory division (e.g., the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media, and independently of other metadata. As discussed above, invalid data may not be removed from the non-volatile memory media until the memory division comprising the data is reclaimed. Therefore, multiple "versions" of data having the same context may exist on the non-volatile memory media (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description.

FIG. 1A is a block diagram of one embodiment of a system 100 comprising a periodic erase module 150. The periodic erase module 150 may be part of and/or in communication with a storage management layer (SML) 130, a non-volatile memory media controller 126, or the like. The SML 130 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 (and/or non-volatile memory controller 124) to a communication network, such as a Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the storage management layer 130 and/or one or more modules thereof may be embodied as one or more computer readable instructions stored on the non-transitory storage media 114.

The storage management layer 130 may be configured to provide storage services to one or more storage clients 116. The storage clients 116 may include local storage clients 116 operating on the computing device 110 and/or remote, storage clients 116 accessible via the network (and network interface 113). The storage clients 116 may include, but are not limited to: operating systems, file systems, database applications, server applications, kernel-level processes, user-level processes, applications, and the like.

Figure 1B:
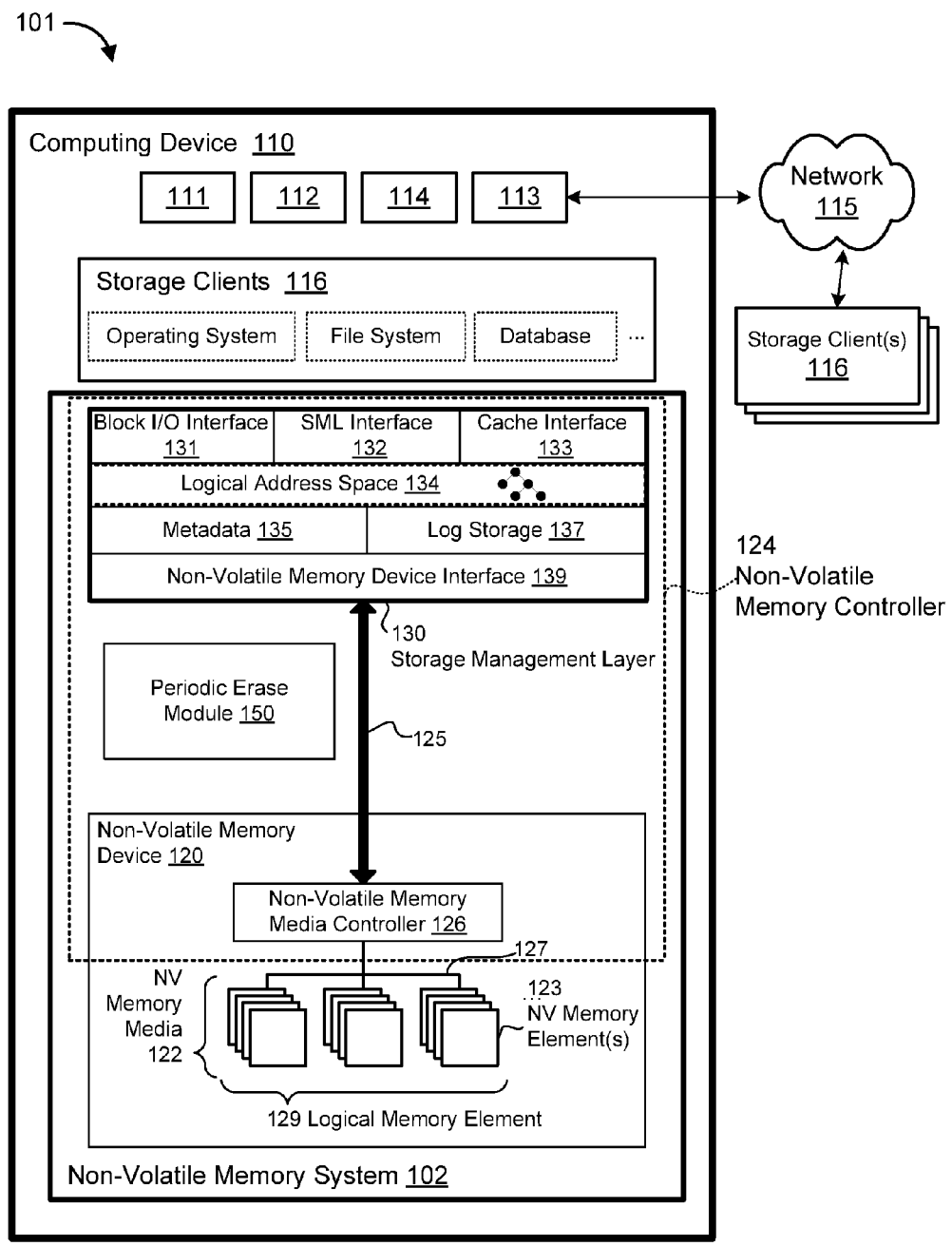
FIG. 1B is a schematic block diagram of another embodiment of a non-volatile memory system comprising a periodic erase module.

The storage management layer 130 comprises and/or is communicatively coupled to one or more non-volatile memory devices 120A-N. The non-volatile memory devices 120A-N may include different types of non-volatile memory devices including, but not limited to: solid-state storage devices, hard drives, SAN storage resources, or the like. The non-volatile memory devices 120A-N may comprise respective non-volatile memory media controllers 126A-N and non-volatile memory media 122A-N. As illustrated in FIG. 1B, The SML 130 may provide access to the non-volatile memory devices 120A-N via a traditional block I/O interface 131. Additionally, the SML 130 may provide access to enhanced functionality (e.g., large, virtual address space) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the non-volatile memory devices 120A-N and/or the non-volatile memory media controllers 126A-N.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations on one or more of the non-volatile memory devices 120A-N. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122A-N, which define an ordered sequence of storage operations performed on the non-volatile memory devices 120A-N, as described above.

The SML 130 may further comprise a non-volatile memory device interface 139 configured to transfer data, commands, and/or queries to the non-volatile memory devices 120A-N over a bus 125, which may include, but is not limited to: a peripheral component interconnect express ("PCI Express" or "PCIe") bus, a serial Advanced Technology Attachment ("ATA") bus, a parallel ATA bus, a small computer system interface ("SCSI"), FireWire, Fibre Channel, a Universal Serial Bus ("USB"), a PCIe Advanced Switching ("PCIe-AS") bus, a network, Infiniband, SCSI RDMA, or the like. The non-volatile memory device interface 139 may communicate with the non-volatile memory devices 120A-N using input-output control ("IO-CTL") command(s), IO-CTL command extension(s), remote direct memory access, or the like.

The non-volatile memory system 102, in the depicted embodiment, includes a periodic erase module 150. The periodic erase module 150 may be configured to determine and/or monitor a use threshold, a degradation threshold, or the like for storage cells of the non-volatile memory device 120 and to apply an extended erase operation to an erase block or other group of storage cells to recondition the storage cells in response to the use threshold, degradation threshold, or the like satisfying a threshold, and may otherwise apply a default erase operation. In other embodiments, the periodic erase module 150 may apply an extended erase operation for each erase of an erase block or other group of storage cells, without using a default erase operation.

In certain embodiments, as the non-volatile memory media controller 124 causes the non-volatile memory media 122 to be programmed and erased by applying various program and erase voltages to floating gates of the storage cells, electron charges may become trapped in a tunnel oxide layer of the storage cells, and may build up over time. Depending on a configuration of the erase operation used, the amount of trapped electrons may vary. For example, for a performance based erase operation, less time may be spent erasing the storage cells to increase performance, which may lead to more trapped electrons in the tunnel oxide layer of the storage cells. Other configurations for erase operations may leave less trapped charges, however these erase operations may last longer, resulting in slower performance.

In certain embodiments, to reduce, minimize, or remove trapped electrons, while still providing the performance benefits of shorter erase operations, the periodic erase module 150 may be configured to perform two or more different types of erase operations. Depending on whether an erase block or other storage region of the non-volatile memory media 122 satisfies a use threshold, an age threshold, a condition threshold, a degradation threshold, or the like, the periodic erase module 150 may periodically perform a modified or extended erase operation in order to recondition the storage cells of the storage region, releasing, freeing, or purging trapped electron charges from a tunnel oxide layer of the storage cells.

As used herein, a use threshold may track, measure, or relate to a state, history, condition, characteristic, age, degradation, error rate, or another property of storage cells of the non-volatile memory media 122. A use threshold may also include or be referred to as a degradation threshold, an age threshold, a condition threshold, an error threshold, or the like, depending on the type of use threshold. In various embodiments, a use threshold may be set relative to and/or describe a program/erase count, a media characteristic, an amount of time since a previous extended erase operation, an error rate (e.g., a raw bit error rate (RBER), an uncorrectable bit error rate (UBER), or the like), an age, an amount of time the non-volatile memory device 120 has been powered on, a duration of a previous erase operation or another property of storage cells of the non-volatile memory media 122.

A use threshold may indicate or be associated with a likelihood that electrons are trapped in tunnel oxide of the storage cells of the non-volatile memory media 122 and/or that an extended erase operation may be useful. A use threshold, an age threshold, a condition threshold, and a degradation threshold are not mutually exclusive. In one embodiment, a use threshold may incorporate a combination of multiple thresholds. For example, a use threshold may include a program/erase count in conjunction with an age metric, or the like. The periodic erase module 150 may use a single use threshold for all of the non-volatile memory media 122; may use different use thresholds for different non-volatile memory elements 123 (e.g., chips, banks, dies, die planes, or the like); may use different use thresholds for different storage regions, such as logical or physical erase blocks, pages, error correction code (ECC) chunks, or the like; or may use another granularity for one or more use thresholds.

In one embodiment, the periodic erase module 150 may be configured to determine or adjust a use threshold for storage cells of the non-volatile memory media 122, based on monitored characteristics, statistics, or properties of the non-volatile memory media 122, such as those described above with regard to the use threshold. In a further embodiment, a manufacturer, vendor, distributor, designer, or the like of the non-volatile memory device 120 may determine, program, and/or hard code one or more use thresholds for the non-volatile memory media 122. In a further embodiment, a use threshold may be provided by and/or selectable by a storage client 116, as part of a storage request, as a setting of a control register, or the like.

The periodic erase module 150 may monitor or track operations for the non-volatile memory device 120 and may determine that an erase block or other set of storage cells contains trapped electrons or has met some other degradation or use threshold. The periodic erase module 150 may periodically apply a modified, customized, or extended erase operation to storage cells of the non-volatile memory media 122 in order to release trapped electrons in the tunnel oxide layer, or otherwise recondition the non-volatile memory media 122. For example, the periodic erase module 150 may perform an extended erase operation in response to a storage region of non-volatile memory media 122 satisfying a use threshold, and may otherwise perform a default erase operation for the storage region, in response to the non-volatile memory controller 124 selecting the storage region for a storage capacity recovery operation.

As described in greater detail below, an extended erase operation may operate using a lower verify voltage, a lower initial voltage, a smaller differential voltage between steps of the erase operation, longer pulse durations of the erase operation, or the like than a default erase operation, and may therefore have a longer duration than a default erase operation. An extended erase operation may be gentler, deeper, and/or slower than a default erase operation, and may release, free, or purge trapped electrons.

As described above, a performance based erase operation, which the periodic erase module 150 may use as a default erase operation, may trap electrons in a tunnel oxide layer of the storage cells. By periodically performing an extended erase operation on an erase block of storage cells, the periodic erase module 150 may maintain the health of the erase block and free at least a portion of the trapped electrons. This may improve the reliability of the storage cells in a performance based application.

For an erased operation configured for reliability instead of performance, electrons may still be trapped in a tunnel oxide layer of the storage cells. Periodically performing an extended erase operation on an erase block of storage cells may improve the condition of the storage cells, may allow a default erase operation to be performed more quickly without significantly affecting the condition of the storage cells, or the like. By periodically performing an extended erase operation, the periodic erase module 150 may improve the performance of a reliability based and/or performance based default erase operation.

In certain embodiments, the periodic erase module 150 may customize the extended erase operation based on a detected condition or satisfied use threshold of an erase block or other set of storage cells. For example, as a program/erase count increases, the periodic erase module 150 may apply longer pulse durations for the extended erase operation, based on the use threshold that the erase block has satisfied (e.g., using one pulse duration at a use threshold of 2,000 cycles, a higher pulse duration at a use threshold of 4,000 cycles, or the like).

In order to maintain maximum performance characteristics for an erase block or other set of storage cells, the periodic erase module 150 may periodically perform an extended erase operation on the erase block. In another embodiment, the periodic erase module 150 may detect that longer erase times are required for a default erase operation for an erase block. In response to longer erase times for a default erase operation, the periodic erase module 150 may lower an erase verify voltage, lower an initial erase voltage level, lower an erase voltage level step size, increase a number of erase voltage level steps, increase an erase pulse duration, and/or increase a number of erase pulses from levels for the default erase operation and perform an extended erase operation with the one or more adjusted erase parameters. Performing an extended erase operation with one or more adjusted erase parameters, in certain embodiments, may erase the storage cells of an erase block more deeply, which may recondition the erase block, lower a time required to erase the erase block using a default erase operation, or the like.

In one embodiment, the periodic erase module 150 may comprise executable software code, such as a device driver, SML 130, or the like, stored on the computer readable storage media 114 for execution on the processor 111. In another embodiment the periodic erase module 150 may comprise logic hardware of one or more of the non-volatile memory devices 120A-N, such as a non-volatile memory media controller 126A-N, a non-volatile memory controller 124, a device controller, a field-programmable gate array ("FPGA") or other programmable logic, firmware for an FPGA or other programmable logic, microcode for execution on a microcontroller, an application-specific integrated circuit ("ASIC"), or the like. In a further embodiment, the periodic erase module 150 may include a combination of both executable software code and logic hardware.

In one embodiment, the periodic erase module 150 is configured to receive storage requests from the SML 130 via a bus 125 or the like. The periodic erase module 150 may be further configured to transfer data to/from the SML 130 and/or storage clients 116 via the bus 125. Accordingly, the periodic erase module 150, in some embodiments, may comprise and/or be in communication with one or more direct memory access ("DMA") modules, remote DMA modules, bus controllers, bridges, buffers, and so on to facilitate the transfer of storage requests and associated data. In another embodiment, the periodic erase module 150 may receive storage requests as an API call from a storage client 116, as an IO-CTL command, or the like. The periodic erase module 150 is described in greater detail below with regard to FIG. 2.

FIG. 1B is a block diagram of another embodiment of a system 101 comprising a periodic erase module 150. As described above, the periodic erase module 150 may be part of and/or in communication with a storage management layer 130. The SML 130 may operate on a non-volatile memory system 102 of a computing device 110, which, as discussed above, may comprise a processor 111, volatile memory 112, communication interface 113, and non-transitory, computer readable storage media 114. The communication interface 113 may comprise one or more network interfaces configured to communicatively couple the computing device 110 (and/or non-volatile memory controller 124) to a network 115 and/or to one or more remote, network-accessible storage clients 116.

The computing device 110 may comprise a non-volatile memory controller 124 that is configured to provide storage services to the storage clients 116. The storage clients 116 may include local storage clients 116 operating on the computing device 110 and/or remote, storage clients 116 accessible via the network 115 (and network interface 113). The non-volatile memory controller 124 comprises one or more non-volatile memory devices 120. Although FIG. 1B depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory ("nano RAM or NRAM"), nanocrystal wire-based memory, silicon-oxide based sub-10 nanometer process memory, graphene memory, Silicon-Oxide-Nitride-Oxide-Silicon ("SONOS"), resistive RAM ("RRAM"), programmable metallization cell ("PMC"), conductive-bridging RAM ("CBRAM"), magneto-resistive RAM ("MRAM"), dynamic RAM ("DRAM"), phase change RAM ("PRAM or PCM"), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on (and read data from) the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (a page of each element of non-volatile memory media 122).

The non-volatile memory controller 124 may comprise a SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

The storage controller 124 manages solid-state storage media 122. The storage controller 124 may include various hardware and software controllers, drivers, and software. Certain storage devices, while appearing to a storage client 116 to be a block storage device, do not directly associate particular logical block addresses with particular physical blocks, also referred to in the art as sectors. Such storage devices may use a logical-to-physical translation layer 134. The logical-to-physical translation layer 134 provides a level of abstraction between the logical block addresses used by the storage client 116, and the physical block addresses at which the storage controller 124 stores the data. The logical-to-physical translation layer 134 maps logical block addresses to physical block addresses of data stored on solid-state storage media 122. This mapping allows data to be referenced in a logical address space using logical identifiers, such as a logical block address. A logical identifier does not indicate the physical location of data on the solid-state storage media 122, but is an abstract reference to the data.

The storage controller 124 manages the physical block addresses in the physical address space. In one example, contiguous logical block addresses may in fact be stored in non-contiguous physical block addresses as the logical-tophysical translation layer 134 determines the location on the solid-state storage media 122 to perform data operations.

Furthermore, in one embodiment, the logical address space is substantially larger than the physical address space. This "thinly provisioned" or "sparse address space" embodiment, allows the number of logical identifiers for data references to greatly exceed the number of possible physical addresses. Specifically, the logical address space may be "sparse" and, as such, may comprise a logical capacity that exceeds the physical storage capacity of the solid-state storage media 122. Accordingly, the logical address space may be defined independent of the solid-state storage media 122; the logical address space may present a larger address space than the physical storage capacity of the solid-state storage media 122, may present different storage location partitions and/or block sizes than provided by the solid-state storage media 122, and so on.

The storage controller 124 may support a sparse address space by writing data using a log-based writing structure. Specifically, the storage controller 124, in one embodiment, writes data of a write request to physical storage media of the solid-state storage media 122 at one or more logical addresses of the physical storage media corresponding to the addresses of the write request as mapped by the logical-to-physical translation layer 134. In a further embodiment, the storage controller 124 writes the data of the write request by appending the data to a sequential, log-based writing structure of the physical storage media of the solid-state storage media 122 at an append point. The storage controller 124, in one embodiment, returns one or more physical addresses corresponding to the append point and the logical-to-physical translation layer 134 maps the one or more logical addresses to the one or more physical addresses corresponding to the append point.

As the storage controller 124 clears, trims, replaces, expires, and/or evicts, data from the physical addresses and associated physical storage media, the solid state storage media 122 in the depicted embodiment, are freed to store data for other logical addresses. In one embodiment, the storage controller 124 stores data at the physical addresses using a log-based writing structure such that data overwritten by a subsequent write request invalidates other data in the log. Consequently, a garbage collection process recovers the physical capacity of the invalid data in the log. One embodiment of the log-based, writing structure is a logically ring-like data structure, as new data is appended to the log-based writing structure, previously used physical capacity is reused in a circular, theoretically infinite manner.

As stated above, in conventional block storage devices, a logical block address maps directly to a particular physical block. When a storage client 116 communicating with the conventional block storage device deletes data for a particular logical block address, the storage client 116 may note that the particular logical block address is deleted and can re-use the physical block associated with that deleted logical block address without the need to perform any other action.

Some non-volatile memory devices 120 may be configured to receive messages or commands notifying the non-volatile memory device 120 of these unused logical blocks so that the non-volatile memory device 120 may deallocate the corresponding physical blocks. As used herein, to deallocate a physical block includes marking the physical block as invalid, unused, or otherwise designating the physical block as available for storage capacity recovery, its contents on non-volatile memory media 122 no longer needing to be preserved by the non-volatile memory controller 124. Data block usage information, in reference to the non-volatile memory controller 124, may also refer to information maintained by the non-volatile memory controller 124 regarding which physical blocks are allocated and/or deallocated/unallocated and changes in the allocation of physical blocks and/or logical-to-physical block mapping information. Data block usage information, in reference to the non-volatile memory controller 124, may also refer to information maintained by the non-volatile memory controller 124 regarding which blocks are in use and which blocks are not in use by a storage client 116. Use of a block may include storing of data in the block on behalf of the client, reserving the block for use by a client 116, or the like.

While physical blocks may be deallocated, in certain embodiments, the non-volatile memory controller 124 may not immediately erase the data on the non-volatile memory media 122. The periodic erase module 150 may perform an erase operation later in time, lazily, opportunistically, or the like. In certain embodiments, the data in a deallocated physical block may be marked as unavailable and/or invalid by the non-volatile memory controller 124 such that subsequent requests for data in the physical block return a null result or an empty set of data.

One example of a command or message for such deallocation is a "Trim" function or command identifying logical blocks to deallocate. A non-volatile memory device 120, upon receiving a Trim command, may deallocate physical blocks for logical blocks whose data is no longer needed by the storage client 116. A non-volatile memory controller 124 that deallocates physical blocks may achieve better performance and increased storage capacity, especially non-volatile memory controllers 124 that write data using certain processes and/or use a similar data storage recovery process.

In one embodiment, the periodic erase module 150 recovers storage capacity of physical non-volatile memory media 122 corresponding to data that is marked as invalid, such as data invalidated by a subsequent write request for one or more logical addresses of the data, or the like. The periodic erase module 150, in certain embodiments, recovers storage capacity of physical non-volatile memory media 122 corresponding to invalid data opportunistically. For example, the periodic erase module 150 may recover storage capacity in response to a storage capacity recovery event, such as a lack of available storage capacity, a percentage of data marked as invalid reaching a predefined threshold level, a consolidation of valid data, an error detection rate for a storage region of physical non-volatile memory media 122 reaching a threshold value, performance crossing a threshold value, a scheduled garbage collection cycle, identifying a storage region of the physical non-volatile memory media 122 with a high amount of invalid data, identifying a storage region of the physical non-volatile memory media 122 with a low amount of wear, or the like.

In one embodiment, the periodic erase module 150 relocates valid data that is in a storage region (e.g., a logical or physical erase block) of the physical non-volatile memory media 122 in the non-volatile memory device 120 that the periodic erase module 150 is recovering to preserve the valid data. For example, the periodic erase module 150 may copy or move valid data from an erase block or other storage region selected for storage capacity recovery forward to an append point of a sequential log-based writing structure, to a new storage region, or the like. Erasing data without relocating the data evicts, removes, deletes, erases, or otherwise clears the data from the non-volatile memory device 120.

In one embodiment, the periodic erase module 150 comprises an autonomous garbage collector system that operates within the non-volatile memory device 120. This allows the non-volatile memory device 120 to manage data to provide wear leveling so that data is systematically spread throughout the solid-state non-volatile memory media 122, or other physical storage media, to improve performance, data reliability, to avoid overuse and underuse of any one location or area of the solid-state non-volatile memory media 122, to lengthen the useful life of the solid-state non-volatile memory media 122, or the like.

The periodic erase module 150, upon recovering a storage region of the physical non-volatile memory media 122, allows the non-volatile memory device 120 to re-use the storage region of the physical non-volatile memory media 122 to store different data. In one embodiment, the periodic erase module 150 adds the recovered storage region of physical non-volatile memory media 122 to an available storage pool for the non-volatile memory device 120, or the like. The periodic erase module 150, in one embodiment, erases existing data in a recovered storage region, using a default erase operation, periodically using an extended erase operation, or the like.

In one embodiment, the periodic erase module 150 recovers storage capacity of the non-volatile memory device 120 one or more storage regions at a time. A storage region, in one embodiment, includes a logical or physical erase block or other predefined division. For flash memory, an erase operation on an erase block writes ones to every bit in the erase block. This may be a lengthy process compared to a program operation which starts with a location being all ones, and as data is written, some bits are changed to zero. However, where the solid-state storage 110 is not flash memory or has a flash memory where an erase cycle takes a similar amount of time as other operations, such as a read or a program, the periodic erase module 150 may erase the data of a storage region as it invalidates data, instead of the periodic erase module 150. Allowing the periodic erase module 150 to operate autonomously and opportunistically within the non-volatile memory device 120 provides a way to separate erase operations from reads, writes, and other faster operations so that the non-volatile memory device 120 operates efficiently.

Figure 2:
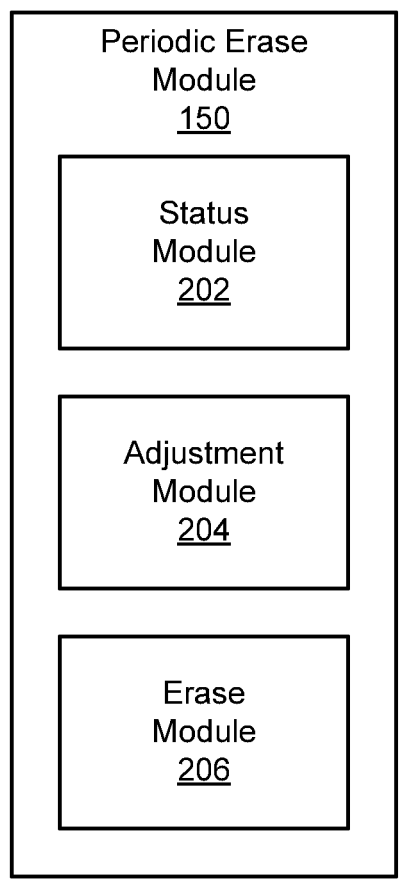
FIG. 2 is a schematic block diagram illustrating one embodiment of a logical representation of a periodic erase module.

FIG. 2 depicts one embodiment of a periodic erase module 150. In the depicted embodiment, the periodic erase module 150 includes a status module 202, an adjustment module 204, and an erase module 206.

In one embodiment, a status module 202 may monitor, estimate, gauge, or measure a use of, degradation of, and/or operations on non-volatile storage cells. As used herein, a use of storage cells may include a program/erase cycle count, an extended erase count, an age, an up-time, an error rate, being in service, being retired (out of service), storing data, not storing data, or the like. A degradation of an erase block may also include a program/erase count, an age, an up-time, an error rate, a degradation condition, being retired, being in service, or the like. A degradation of an erase block may also include an erase duration, presence of trapped electrons in a tunnel oxide layer, an error rate, or the like. Therefore, a "use" and a "degradation" are not mutually exclusive.

In one embodiment, the status module 202 may measure a duration or a storage execution time of a default erase operation on an erase block. As previously described, non-volatile storage cells that experience use, may build up trapped electrons in a tunnel oxide layer of the erase block. Stored electrons in the tunnel oxide layer may effect an applied electrical field to the tunnel oxide layer and may require a higher voltage electrical field to be applied in order to erase the erase block. This may cause a default erase operation to take more time than with an erase block that does not have trapped electrons in the tunnel oxide layer.

Figure 3A:
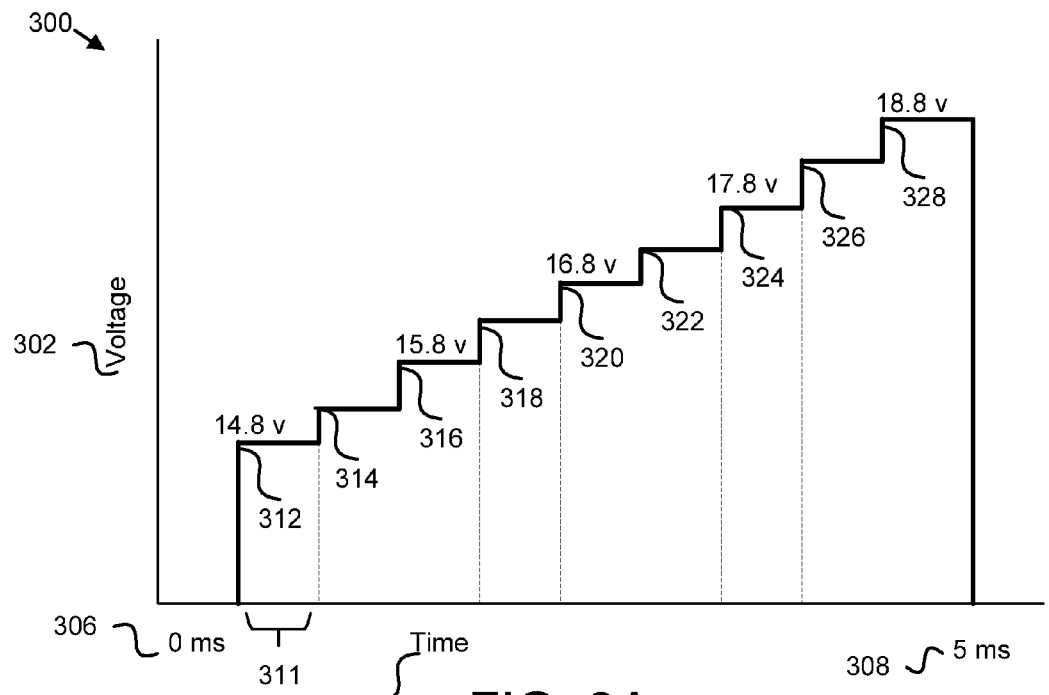
FIG. 3A is a chart illustrating one example of an embodiment of an erase cycle for non-volatile storage cells.
Figure 3B:
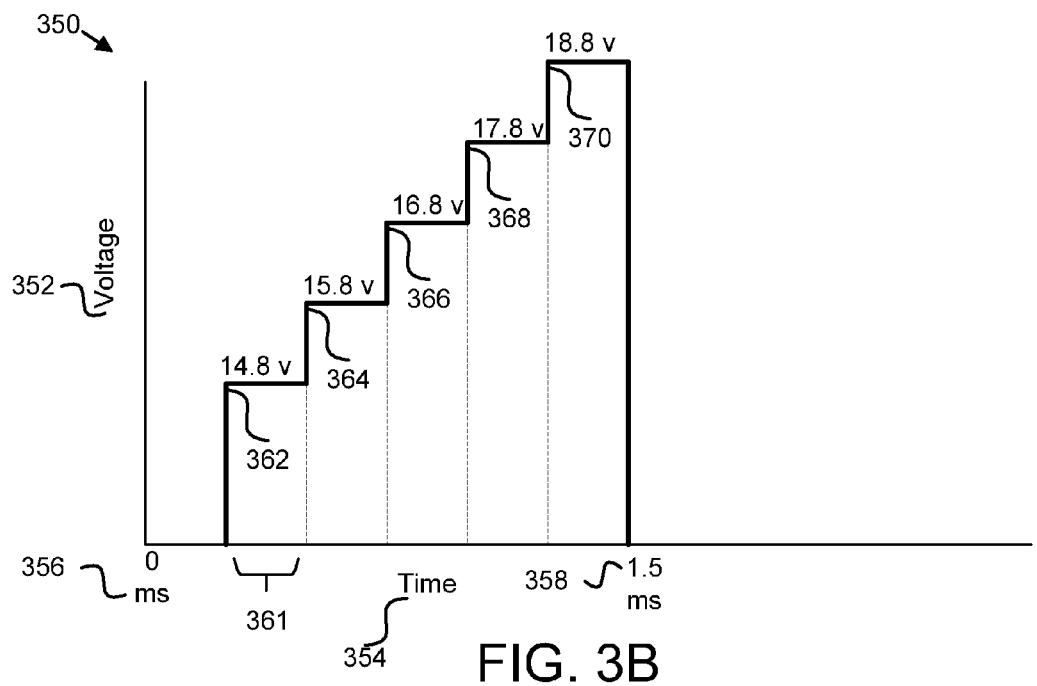
FIG. 3B is a chart illustrating another example of an embodiment of an erase cycle for non-volatile storage cells.
Figure 4:
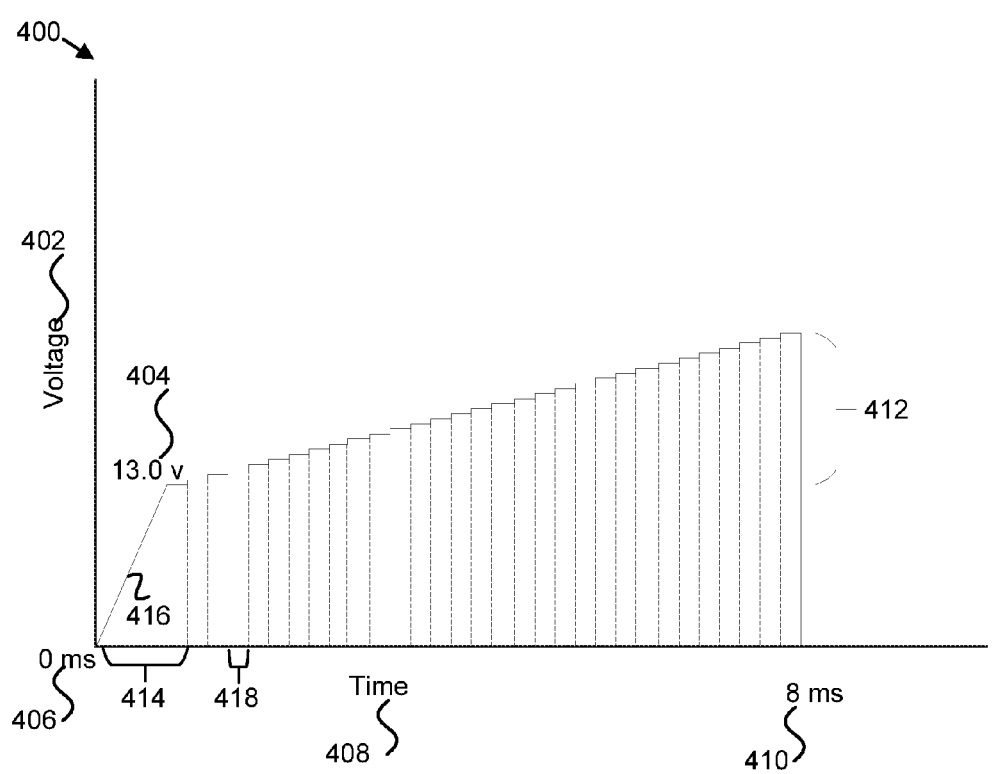
FIG. 4 is a chart illustrating one example of one embodiment of an erase cycle for non-volatile storage cells.

As depicted in FIGS. 3 and 4, the periodic erase module 150, using the erase module 206 or the like, may erase storage cells of erase blocks by applying incrementally higher voltage levels until a verify voltage indicates that the erase was successful. In one embodiment, an erase verify voltage may be enforced separately for even word lines or pages and odd word lines or pages of an erase block, which may have different characteristics. For example, after applying several discrete erase pulse iterations, odd word lines may satisfy an erase verify voltage indicating a successful erase, but even word lines may fail to satisfy the verify voltage, indicating that the erase was not successful, or vice versa. The periodic erase module 150 may apply additional erase pulse iterations for a failed set of word lines (e.g., even or odd) until the failed set satisfies the erase verify voltage. In this manner, an extended erase operation, or a portion of an extended erase operation, may apply to portions of an erase block, which may limit exposure to high erase voltages or additional erase pulses, for other portions of an erase block that are successfully erasing at lower erase voltage levels.

Because trapped electrons in the tunnel oxide layer may require higher voltages to be applied, more iterations to be applied, or the like before successfully erasing an erase block, it may take longer to erase the erase block where there are trapped electrons. Therefore, in certain embodiments, an increasing duration required to erase an erase block using a default erase operation may indicate trapped electrons in the tunnel oxide layer of an erase block. In one embodiment, a status module 202 may detect stored electrons in a tunnel oxide layer of an erase block by monitoring or measuring a duration or execution time of an erase operation on the erase block.

In another embodiment, the status module 202 may compare an erase duration with an erase duration threshold or other use threshold. For example, an erase duration threshold may be 3 milliseconds, or the like. In this example, if an erase duration for an erase block takes longer than 3 milliseconds to complete, the status module 202 may flag the erase block as degraded, and may indicate that the erase block requires an extended erase operation.

In another embodiment, the status module 202 may measure a voltage reached during an erase operation. As previously described, trapped electrons in a tunnel oxide layer may require a higher voltage to be applied before an erase block will erase. An increasing voltage required to erase an erase block may indicate trapped electrons in the tunnel oxide layer of the erase block. In one embodiment, a status module 202 may detect stored electrons in a tunnel oxide layer of an erase block by monitoring or measuring a peak voltage required to erase an erase block.

In another embodiment, the status module 202 may compare a peak voltage to a peak voltage threshold or other use threshold. For example, a peak voltage required to erase an erase block may exceed 17.8 volts. In this example, if a peak voltage required to erase an erase block exceeds 17.8 volts, the status module 202 may flag the erase block as degraded, and may indicate that the erase block requires an extended erase operation.

In another embodiment, the status module 202 may measure a program/erase count of an erase block. A status module 202 may count the number of times an erase block is programmed and erased. Flash based storage devices have limited endurance and program/erase cycles may gradually degrade the erase block or may lead to trapped electrons in a tunnel oxide layer of the erase block. Over many program/erase cycles, the erase block may perform more poorly. In one embodiment, regardless of actual performance, the status module 202 may determine that an erase block requires an extended erase operation based on the number of program/erase cycles the erase block has endured.

In another embodiment, the status module 202 may compare a program/erase cycle count with a program/erase cycle count threshold or other use threshold. In one example, where a single level NAND flash is rated at 100,000 cycles before anticipated failure, a storage controller 124 may define a program/erase cycle threshold at 5,000 cycle intervals. In this example, the status module 202 may count program/erase cycles for an erase block and indicate that the erase block requires an extended erase operation after 5,000 cycles. In another example, a storage controller 124 may define a program/erase recondition interval at 5,000 cycles. In this example, the status module 202 may again indicate a required extended erase operation again after 10,000 total cycles, 15,000 total cycles, or the like. In one embodiment, the status module 202 may or may not consider the actual performance characteristics of the erase block. A storage controller 124 may specify other values depending on the physical characteristics or use of the storage cells. For example, a multi-level NAND flash may be rated at 5,000 cycles before anticipated failure. In this example, a storage controller 124, may specific 500 cycles, or less, between extended erase operations.

In another embodiment, the status module 202 may define different types of use thresholds, different stages of use thresholds, or the like. In one example, the status module 202 may determine to perform an extended erase at program/erase counts of 5,000, 8,000, then every 2,000 cycles. Depending on the performance characteristics or the condition of the erase block, the status module 202 may customize or define specialized intervals for different use and/or degradation thresholds.

In another example, the status module 202 may measure an up-time of an erase block. As used herein, an "up-time" for an erase block may include the amount of time passed with the erase block being powered or available for use. In this example, a status module 202 may measure the time an erase block is powered and available for use. Flash based storage devices may also degrade over time regardless of use. Over time, the performance of an erase block may decline even if the storage cells do not currently store data. In one embodiment, regardless of actual performance, the status module 202 may determine that an erase block requires an extended erase operation based on the time an erase block is powered or available for use.

In another embodiment, the status module 202 may compare an up-time with an up-time threshold or other use threshold. In one example, a storage controller 124 may indicate that an erase block be reconditioned every 30 days of use, regardless of actual or measured performance, or other degradation condition. In this example, the status module 202 may measure an up-time associated with an erase block, and indicate a required extended erase operation after an erase block has been in use for more than 30 days. Other up-time threshold may be used depending on physical characteristics of the storage cells. Erase blocks with better endurance, may allow more up-time between extended erase cycles to maintain optimal performance.

In another embodiment, the status module 202 may monitor a bit error rate (BER) for an erase block on the non-volatile media 122. A BER for an erase block of the non-volatile memory device 102 may be expressed as a percentage of the number of decoded bits that are incorrect, divided by the total number of bits read from the erase block. In one embodiment, the bits may be correctable via an ECC checksum, or the like. In other embodiments, the errors may be uncorrectable. A bit error rate may include a raw bit error rate (RBER), an uncorrectable bit error rate (UBER), or the like.

As used herein, a RBER includes a rate of errors in bits read from storage cells before they are corrected. Although there may be raw bit errors in data read from an error block, the bits may be corrected by an ECC checksum, or the like. Raw bit errors may be caused by noise, interference, distortion, or bit synchronization errors. Therefore, raw bit errors may or may not indicate a failing erase block. However, a consistently increasing number of raw bit errors from a specific erase block, may indicate a degraded condition of the erase block. In one embodiment, a status module 202 may detect an increasing rate of raw bit errors, and indicate that the erase block requires an extended erase operation.

Similar to raw bit error rates (RBERs), an uncorrectable bit error rates (UBERs) may indicate a failing erase block. In this example, a status module 202 may detect an increasing rate of uncorrectable raw bit errors, and indicate that the erase block requires an extended erase operation.

In another embodiment, the status module 202 may compare a bit error rate (e.g., RBER, UBER, or the like) to a bit error rate threshold or other use threshold. In one example, a storage controller 124 may indicate a bit error rate of $10^{-9}$. A bit error rate of $10^{-9}$ means that 1 bit out of every $10^9$ bits is incorrect. In this example, the status module 202 may measure a bit error rate associated with an erase block, and if the current bit error rates is above the bit error rate threshold (e.g., includes more than 1 error bit out of every $10^9$ bits) the status module 202 may indicate that the erase block requires an extended erase operation. Of course, this disclosure is not limited in this regard. Other bit error rates may be used depending on many factors, including, but not limited to, operating conditions, environment, technological advances, or the like.

In one embodiment, the periodic erase module 150 may also include an adjustment module 204. As a NAND data storage device 102 ages, erase operations may take longer due to trapped charges in tunnel oxides and device material interfaces, amplifying the effects that erase operations have on the latency of other operations. The adjustment module 204, in certain embodiments, compensates for such changes in characteristics of the storage media 122 by dynamically adapting erase parameter adjustments over time. The adjustment module 204 may adjust an erase parameter in response to a change of a predefined magnitude, a change that satisfies an adaptation threshold or other use threshold, or the like. In one embodiment, the adjustment module 204 may determine a characteristic for an adjustment using a set of predefined adjustment rules that output an adjustment or adjustment characteristic based on characteristics of the data storage media 122, or the like.

As used herein, an erase parameter for a set of storage cells or other non-volatile memory media 122 is a parameter of an erase operation that is modifiable by way of an interface. In one embodiment, an erase parameter is modifiable by storing a value for the erase parameter in a control register or other memory buffer of a non-volatile memory element 123. The interface may comprise a publicly known interface or a proprietary interface and may include use of particular command instructions and/or use of particular parameters, register settings, driver settings, controller settings, a particular set of command instruction sequences, or other differences from regular commands (e.g., general purpose commands) or settings used to interface with or manage the set of storage cells.

Erase parameters may relate to erasing storage cells, managing storage cells, device driver or storage/memory controller settings for storage cells, or the like. An erase parameter for a set of storage cells may be associated with a device driver for the non-volatile memory device 120, with a non-volatile memory controller 124, or the like, and may relate to how the device driver and/or non-volatile memory controller 124 erase, use, manage, or interact with the set of storage cells and/or the non-volatile memory media 122.

An erase parameter, in certain embodiments, may include one or more erase voltage thresholds, erase verify voltage thresholds, erase pulse duration thresholds, erase iteration step sizes, erase iteration count threshold, erase operation duration threshold, initial erase voltage thresholds, or the like. The erase parameter may be set during initialization of the non-volatile memory media 122, dynamically with each erase command issued to the non-volatile memory media 122, or during operation of the non-volatile memory media 122 in response to triggers such as storage capacity recovery events or time intervals. The adjustment module 204, in one embodiment, proactively sets one or more erase parameters for erase operations on storage cells of the non-volatile memory media 122 to manage the non-volatile memory media 122, to reduce errors, to increase performance, to recondition storage cells, or the like.

The adjustment module 204, in certain embodiments, overrides the default level for one or more erase parameters, setting the one or more erase parameters to a different level based on media characteristics of the non-volatile memory media 122. The adjustment module 204 may set the erase parameters to a level that decreases the amount of errors that the non-volatile memory media 122 encounters when compared to the default level, to a level that increases the amount of errors that may be detected and corrected when compared to the default level, to a level that increases the number of input/output operations per second (IOPS) of the non-volatile memory media 122 when compared to the default level, to a level that increases the usable life of the non-volatile memory media 122 when compared to the default level, and/or that otherwise improves the utility of the non-volatile memory media 122 when compared to the default level.

In certain embodiments, the non-volatile memory device 120, each non-volatile memory element 123, or the like, may include multiple control registers or other memory buffers to store erase parameters. The adjustment module 204 may base an erase parameter on one or more media characteristics by entering the one or more media characteristics into an equation, into a mathematical model, into a lookup table (LUT), into a matrix, or the like; by performing a predefined transform or operation on the one or more media characteristics; or by otherwise referencing and/or manipulating the one or more media characteristics to determine the erase parameter.

An erase parameter equation, mathematical model, LUT, matrix, or the like may be based on empirical data, such as test data, historical data, and the like. A design engineer or the like, in one embodiment, may test sets of storage cells with various media characteristics, such as non-volatile memory media from various manufacturers or the like, and determine optimal erase parameters for storage cells with the various media characteristics. For example, an equation, mathematical model, LUT, matrix, or the like may indicate that non-volatile memory media 122 from manufacturer X tends to have Y amount of natural drift in cell values after 1,000 program/erase cycles such that a read threshold can be increased by Z volts to compensate, or the like.

In other embodiments, the adjustment module 204 may dynamically determine an erase parameter; an equation, mathematical model, LUT, matrix, transform, or the like to define an erase parameter; an adjustment to an erase parameter; or the like during operation of the non-volatile memory device 120. For example, the adjustment module 204 may determine erase parameters for various media characteristics initially based on trial and error, based on a direction of an error (e.g., from a binary one to a binary zero or vice versa), or the like and may autonomously correlate the effectiveness of the erase parameter, based on a change in an error rate such as a raw bit error rate (RBER), an uncorrectable bit error rate (UBER), or the like, to determine an equation, mathematical model, LUT, matrix, transform, or the like for determining subsequent erase parameters and/or erase parameter adjustments.

A media characteristic is a statistic, heuristic, mathematical model, transform, or other descriptor associated with an attribute of the non-volatile memory media 122. A media characteristic for a set of storage cells may be substantially static or may be dynamic and change over time.

A media characteristic, in one embodiment, includes or relates to a make, a model, a manufacturer, a product version, or the like for the non-volatile memory device 120 and/or for the non-volatile memory media 122. In another embodiment, a media characteristic describes an attribute or statistic for a set of particular storage cells, such as a program/erase cycle count for the set of storage cells, a read count for the set of storage cells, a retention time since a previous write for the set of storage cells, a dwell time for the set of storage cells such as a logical or physical erase block (e.g., a time between a program of an erase block and an erase of the erase block), an average of multiple previous dwell times for the set of storage cells, an error statistic for the set of storage cells, or the like. A media characteristic, in a further embodiment, may include or relate to an environmental condition or a use of the non-volatile memory device 120 and/or of the non-volatile memory media 122, such as a temperature, a use case (e.g., a cache use case, an archival use case, a server use case, an enterprise use case, a consumer use case), or the like.

A media characteristic for a set of storage cells affects or informs the determination of an erase parameter for the set of storage cells. In one embodiment, the media characteristics include a program/erase cycle count for a set of storage cells. In another embodiment, the media characteristics include a read count for a set of storage cells. The media characteristics, in a further embodiment, include a retention time since a previous write for a set of storage cells. In an additional embodiment, the media characteristics include a temperature for a set of storage cells. The media characteristics, in certain embodiments, include a use case for a set of storage cells. In another embodiment, the media characteristics include an error statistic for a set of storage cells, such as an UBER, a RBER, or the like. In a further embodiment, the media characteristic may include previous or historical erase parameters for a set of storage cells, erase parameters or media characteristics for other sets of storage cells, or the like.

An adjustment module 204 may adjust various parameters for the extended erase operation. The adjustments may be based on detected characteristics previously described, use thresholds, degradation thresholds, or the like, or other condition determined by the status module 202. In one embodiment, the adjustment module 204 may modify a verify voltage, an initial erase voltage level, an erase voltage level step size, a number of erase voltage level steps, an erase verify voltage level, an erase pulse duration, or the like. The adjustment module 204 may be configured to store adjusted parameters for the extended erase operation in control registers for the non-volatile media 122.

In one embodiment, the adjustment module 204 may adjust an initial erase voltage level for an erase block of the non-volatile storage cells. As previously described, and as further described in FIGS. 3 and 4, erase blocks may be erased by applying incrementally higher voltage levels until a verify voltage indicates that the erase block has been successfully erased. In one embodiment, the adjustment module 204 may lower the first (or initial) voltage level. For example, the adjustment module 204 may lower the initial voltage from 14.8 volts to 13 volts, or lower. The adjustment module 204 may lower the initial voltage to various lower values independently for each different erase block.

In one embodiment, the adjustment module 204 may adjust an erase voltage step size. In one example, the adjustment module 204 may reduce the erase voltage step size from 0.5 volts, to 0.2 volts, or less. In another embodiment, the adjustment module 204 may reduce step sizes and the adjustment module 204 may increase the number of erase voltage level steps in order to include a similar peak voltage, as before an erase voltage step size had been adjusted.

For example, if step sizes were reduced from 0.5 volts to 0.2 volts, and there were initially 8 voltage steps in the erase operation, the adjustment module 204 may increase the number of erase voltage steps from 8 to 20. This may cause the peak voltage to be substantially the same as before the erase step voltage had been changed, although this is not necessarily the case. For example, the adjustment module 204 may not increase the number of erase voltage steps.

In another embodiment, the adjustment module 204 may adjust the number of discrete erase pulse iterations. These discrete pulses of erase voltage applications may also be referred to as erase pulse iterations, where an erase operation, or an extended erase operation may include many erase pulse iterations (e.g., discrete erase pulse voltage applications). For example, the adjustment module 204 may increase the number of erase pulse iterations from 8 to 20. This may cause a more gradual increase in voltage being applied to the erase block, as the number of erase pulses is increased. In response to increasing the number of erase pulse iterations from 8 to 20, the adjustment module 204 may also decrease a voltage differential between erase pulse iterations of the erase operation. This may or may not cause the peak voltage to be affected by the increased number of erase pulse iterations.

In another embodiment, the adjustment module 204 may modify a pulse duration of erase pulse iterations for the erase operation. In one example, the adjustment module 204 may increase a pulse duration from a default erase iteration of 0.5 milliseconds, to an adjusted pulse duration of 1 millisecond. In an example, where an erase operation includes 8 erase voltage steps, and the erase voltage step sizes are 0.5 volts, the adjustments may cause an erase operation to take up to 8 milliseconds or longer. This may result in a more gradual increase in voltage until a verify voltage indicates that the erase operations has been successful. A more gradual increase in voltage may be more effective in releasing trapped electrons in a tunnel oxide layer of the erase block.

In another embodiment, the adjustment module 204 may adjust pulse durations for erase pulse iterations of an erase operation independently. In one embodiment, initial erase voltage steps may be longer, while later erase pulse iterations, near the peak voltage, may be shorter. In another embodiment, initial erase voltage steps may be shorter, while later erase iteration, near the maximum voltage may be longer. In one embodiment, each of the step durations may be substantially similar.

In one embodiment, the periodic erase module 150, may include an erase module 206. An erase module may perform an extended erase operation based, at least in part, on the adjusted parameters by the adjustment module 204.

As depicted in FIGS. 3 and 4 erase blocks may be erased by applying incrementally higher voltage levels until a verify voltage indicates that the erase was successful. In one embodiment, between each of the voltage levels of the erase operation, the erase module 206 may determine if the erase block is erased by measuring an erase verify voltage. In one example, the erase module 206 measures the erase verify voltage between erase pulse iterations (e.g., erase voltage steps or applications) of the erase operation. In another embodiment, the erase module 206 may terminate a remainder of an erase operation after determining that a verify voltage meets a specified threshold.

In another embodiment, the adjustment module 204 may reduce a verify voltage for an erase operation for the non-volatile storage cells. In one embodiment, the adjustment module 204 reduces an erase verify voltage level for the extended erase operation from a default erase verify voltage level of the default erase operation, to a lower erase verify voltage level. For example, the status module 202 may determine that an erase block requires an extended erase operation, the adjustment module 204 may reduce the erase verify voltage from −2.0 volts, to −3.0 volts. A lower verify voltage may indicate that the erase block has been more thoroughly erased, and less likely that the erased block still has trapped electrons in the tunnel oxide layer.

In one embodiment, setting a lower verify voltage level may cause the erase operation to reach a higher applied erase voltage level before the erase block successfully erases (e.g., an erase block must be more cleanly erased before it meets a lower erase verify voltage). In another embodiment, the higher voltage required to erase an erase block (e.g., because of a lowered erase verify voltage) may exceed a peak or maximum voltage. Therefore, in one embodiment, an erase operation may terminate before an erase block has been successfully erased.

In one embodiment, a status module 202 may detect an increasing number of erase blocks that are failing to erase (e.g., at a lower erase verify voltage), and may raise the verify voltage level more closely to the default erase verify voltage. For example, a status module 202 may raise a lowered verify voltage from −3.0 volts to −2.5 volts, to be closer to a default verify voltage of −2.0 volts. In another embodiment, the adjustment module 204 may detect the failed erases and adjust the erase verify voltage as indicated.

In one embodiment, the periodic erase module 150, may include an erase module 206. An erase module 206 may perform an extended erase operation based, at least in part, on the adjusted parameters by the adjustment module 204.

As depicted in FIGS. 3 and 4 (described in later paragraphs) erase blocks may be by applying incrementally higher voltage levels until a verify voltage indicates that the erase was successful. In one embodiment, between each of the voltage levels of the erase operation, the erase module 206 may determine if the erase block is erased by measuring an erase verify voltage. In one embodiment, the erase module 206 measures the erase verify voltage between erase pulse iterations (e.g., erase voltage steps or applications) of the erase operation. In another embodiment, the erase module 206 may terminate a remainder of an erase operation after determining that a verify voltage meets a specified threshold.

In one embodiment, a status module 202 may detect that a set of erase blocks need an extended erase operation. The adjustment module 204 may then reduce the verify voltage for the set of erase blocks from −2.0 volts to −3.0 volts. At this lower erase verify voltage, many of the erase blocks may fail to erase (e.g., a maximum erase voltage was applied and the lowered verify voltage still does not indicated an erased block). In response to erase blocks that have failed to erase at a lower erase verify voltage, the erase module 206 (or the adjustment module 204) may raise the verify voltage from −3.0 volts, to −2.5 volts. The erase module 206 may try again to erase the erase blocks that failed to erase. If the erase block still fails to erase, the erase module 206 may continue to raise the erase verify voltage until the erase block successfully erases.

In one embodiment, the erase module 206 functions as a background task. In another embodiment, while a storage controller 124 is storing data is some erase blocks on a non-volatile storage medium, the erase module 206 may concurrently erase other erase blocks on the non-volatile storage medium. In another embodiment, the erase module 206 may temporarily pause erasing erase blocks based on a current read or write request by the storage controller 124.

In one embodiment, the status module 202 may indicate to an erase module 206 that an erase block requires an extended erase operation, and the erase block may currently store data. The erase module 206 may move data stored to another erase block before performing the extended erase operation on the indicated erase block. In another embodiment, the erase module 206 may wait to perform the extended erase operation until the next time the erase block requires an erase.

FIG. 3A is a chart illustrating one example of an erase operation 300 for non-volatile storage cells. The chart plots voltage 302 as a function of time 304. In this example 300, an erase operation may include up to 9 erase pulse iterations. In this example, the erase module 206 may begin at 0 milliseconds 306 by applying an initial voltage 312 of 14.8 volts. The erase module 206 may apply an initial pulse duration 311 of approximately 0.6 milliseconds, and the erase module 206 may measure a verify voltage to determine if the erase block had erased. If the erase block had erased, the erase operation may terminate. If the erase bock had not erased (e.g., the verify voltage was not met), the erase module 206 may apply the next erase voltage level 314 of 15.3 volts. The erase module 206 may measure a verify voltage to determine if the erase block had erased. In this example, the erase module 206 may continue in like manner, by applying subsequent erase voltage levels 316, 318, 320, 322, 324, 326, 328 of 15.8 volts, 16.3 volts, 16.8 volts, 17.3 volts, 17.8 volts, 18.3 volts, and 18.8 volts. The erase module 206 may, between applications of erase voltage levels, determine if the erase block had erased, and terminate if it had. In this example, the erase operation may complete at 5 milliseconds 308, or earlier.

In one embodiment, a periodic erase module 150 may apply an erase operation as disclosed in FIG. 3A as a default erase operation, and an extended erase operation may have a greater number of erase pulse iterations, smaller erase voltage steps, a lower erase verify voltage threshold, different erase pulse widths, or the like. In another embodiment, a periodic erase module 150 may apply an erase operation as disclosed in FIG. 3A as an extended erase operation, and a default erase operation may have fewer erase pulse iterations, larger erase voltage steps, a higher erase verify voltage threshold, different erase pulse widths, or the like.

FIG. 3B is a chart illustrating one example of an erase operation 350 for non-volatile storage cells. The chart plots voltage 352 as a function of time 354. In this example, the erase operation may occur between 0 milliseconds 356 and 1.5 milliseconds 358. As previously discussed regarding FIG. 3A, the erase module 206 may begin at 0 milliseconds 306 by applying an initial voltage 362 of 14.8 volts. The erase module 206 may apply an initial pulse duration 361 of approximately 0.3 milliseconds, and the erase module 206 may measure a verify voltage to determine if the erase block had erased. If the erase block had erased, the erase operation may terminate. If the erase bock had not erased (e.g., the verify voltage was not met), the erase module 206 may apply the next erase voltage level 364 of 15.8 volts. The erase module 206 may measure a verify voltage to determine if the erase block had erased. In this example, the erase module 206 may continue in like manner, by applying subsequent erase voltage levels 366, 368, 370 of 15.8 volts, 16.8 volts, 17.8 volts, and 18.8. The erase module 206 may, between applications of erase voltage levels, determine if the erase block had erased, and terminate if it had. In this example, the erase operation may complete at 1.5 milliseconds 358, or earlier.

As depicted in FIG. 3B, in one embodiment, the erase operation 350 includes fewer erase pulse iterations, but larger voltage differentials between erase voltage levels for each iteration. This kind of fast erase, may leave more trapped electrons in a tunnel oxide layer of the non-volatile storage cells, but may erase an erase block more quickly. The periodic erase module 150, in certain embodiments, may use the erase operation 350 of FIG. 3B as a default erase operation and may use the erase operation 300 of FIG. 2A as an extended erase operation, or the like.

In one example, an erase operation includes 5 erase pulse iterations, but may include more if an erase verify voltage threshold is not satisfied after the 5 erase pulse iterations. In this example, the erase module 206 begins by applying an initial voltage of 14.8 volts. After an initial pulse duration of around 0.25 milliseconds, the erase module 206 may measure a verify voltage to determine if the erase block had erased. If the erase block had erased, the erase operation may terminate. If the erase bock had not erased (e.g., the verify voltage was not met), the erase module 206 may apply the next erase voltage level of 15.8 volts. As before, the erase module 206 may measure a verify voltage to determine if the erase block had erased. In this example, the erase module 206 may continue in a similar manner, by apply subsequent erase voltage levels of 15.8 volts, 16.8 volts, 17.8 volts, and 18.8 volts. The erase module 206 may, between applications of erase voltage levels, determine if the erase block had erased, and terminate if it had.

FIG. 4 is a chart illustrating one example of an extended erase operation 400 for non-volatile storage cells. In this example, a chart plots voltage 402 as a function of time 408. FIG. 4 is only one example of an extended erase operation. In one embodiment, an extended erase operation, as previously indicated may be modified, customized, adjusted, or the like, based on a variety of properties or media characteristics of non-volatile storage cells. As such, an extended erase operation is not limited by any specific feature of the example depicted in FIG. 4.

In the example depicted in FIG. 4, the erase module 206 gradually ramps 416 up to the initial voltage of 13.0 volts 404. This example, an erase operation may include 31 erase voltage pulse iterations or more that may be applied over a time of 0 milliseconds 406 to 8 milliseconds 410. Other examples of extended erase operations may take much longer than 8 milliseconds to complete, based on an age or degradation of the storage cells. In this example, as previously described regarding FIGS. 3A and 3B, the erase module 206 may check a verify voltage between each of the erase pulse iterations for the erase block. In this example, a pulse duration 418 of each of the erase pulse iterations is approximately 0.2 milliseconds. This example of an erase operation may continue by applying subsequent erase voltage levels 412 until either the erase block is erased, or the erase operation concludes.

Again, this disclosure is not limited in this regard. Other pulse durations may be used depending on properties or characteristics, use thresholds, degradation thresholds, or the like, as detected by the status module 202.

In one embodiment, an extended erase operation ramps up more slowly than a default erase operation. In another embodiment, the initial erase voltage may be higher or lower than the default initial erase voltage 404. In another embodiment, the voltage step sizes may be smaller, and the pulse durations may be shorter. In other embodiments, the pulse durations may be longer, and may be up to 1 millisecond or more, depending on the condition of the storage cells, as previously indicated. In another embodiment, there may be less than 8 erase pulse iterations. In one embodiment, there may be 30 erase pulse iterations or more. In another embodiment, the maximum applied erase voltage for an extended erase operation may or may not be higher or lower than a default maximum applied erase voltage.

Figure 5:
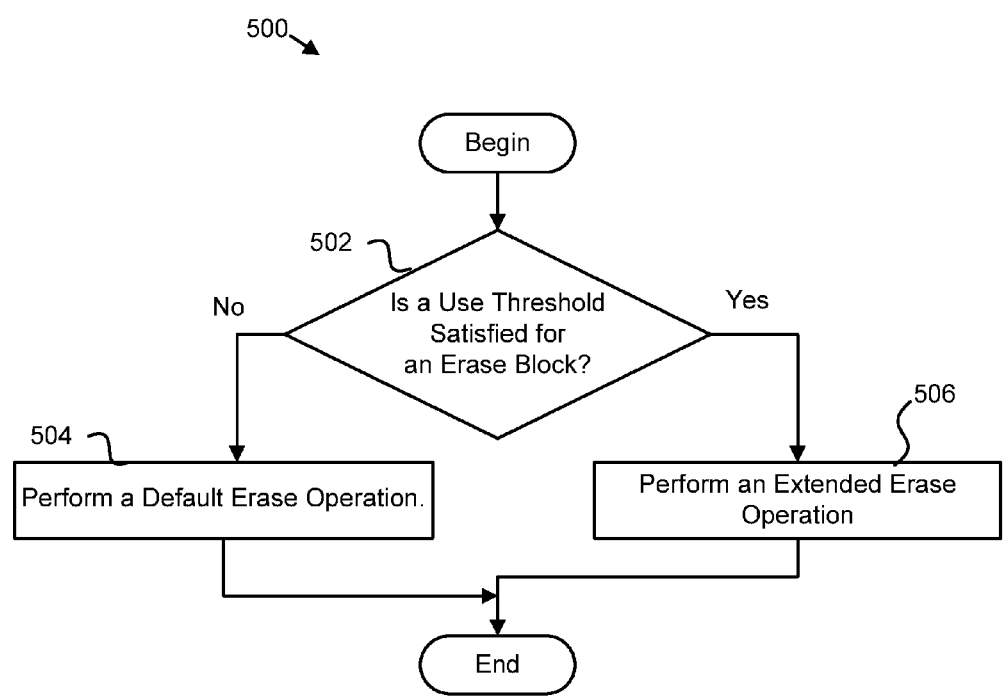
FIG. 5 is a schematic flow chart diagram illustrating one embodiment of a method for erasing non-volatile storage cells.

FIG. 5 is a schematic flow chart diagram illustrating one embodiment of a method for erasing non-volatile storage cells. The method 500 begins and a status module 202 determines 502 if a use threshold is satisfied for an erase block. If not, an erase module 206 performs 504 a default erase operation on the erase block. If so, an erase module 206 performs 506 an extended erase operation on the erase block. The method ends.

Figure 6:
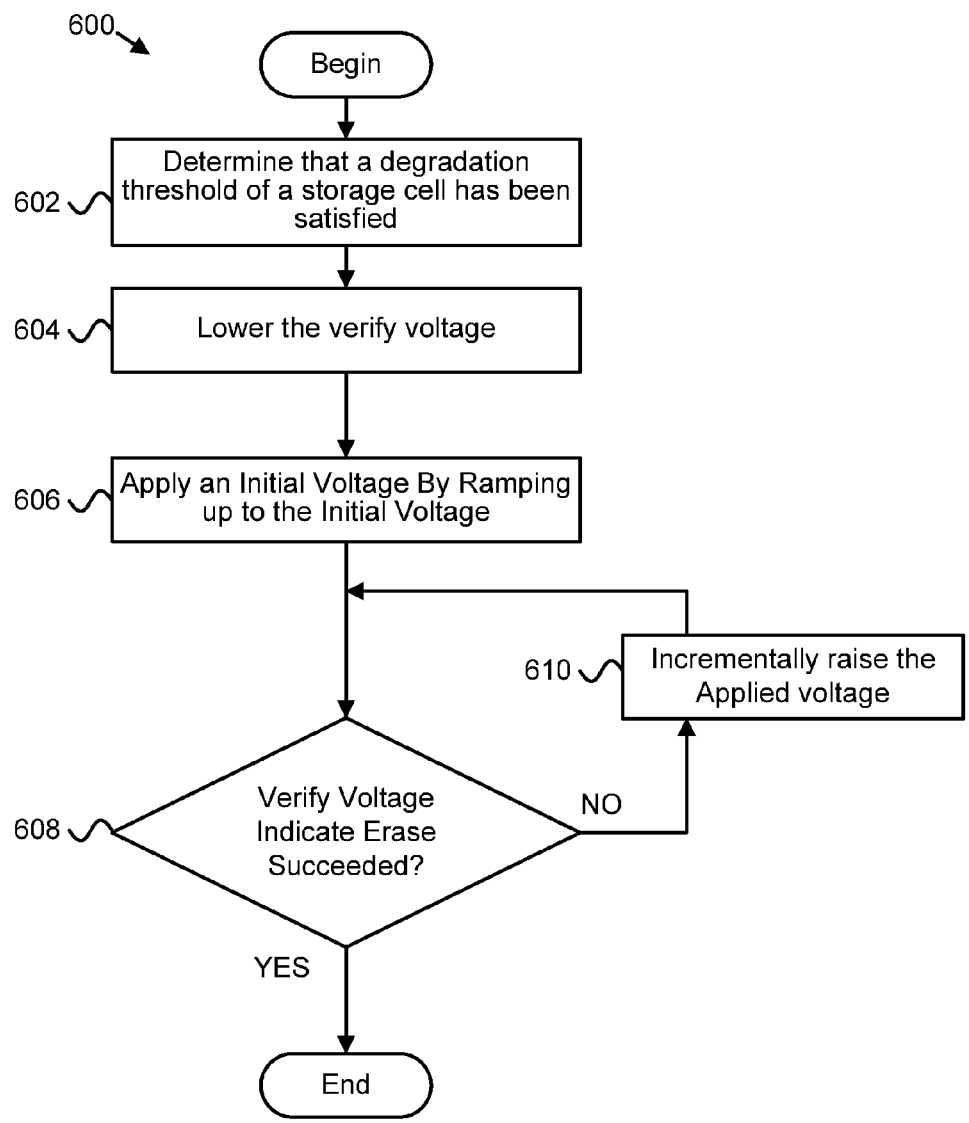
FIG. 6 is a schematic flow chart diagram illustrating one embodiment of a method for performing an extended erase on non-volatile storage cells.

FIG. 6 is a schematic flow chart diagram illustrating one embodiment of a method for performing an extended erase on non-volatile storage cells. The method 600 begins and status module 202 determines 602 that a degradation threshold for an erase block is satisfied. The adjustment module 204 lowers the verify voltage. The erase module 206 then applies 606 an initial voltage by ramping up to the initial voltage. For example, ramping up to the initial erase voltage level may be gradually increasing the applied voltage from 0 volts to the initial erase voltage level over a period of 0.1 milliseconds. The erase module 206 determines 608 if the verify voltage indicates that the erase block is erased. If so, the method ends. If not, the erase module 206 applies the next erase voltage level as indicated by the adjustment module 204. The erase module 206 continues until the verify voltage indicates that the cell is erased, or until a maximum applied erase voltage is surpassed.

Figure 7:
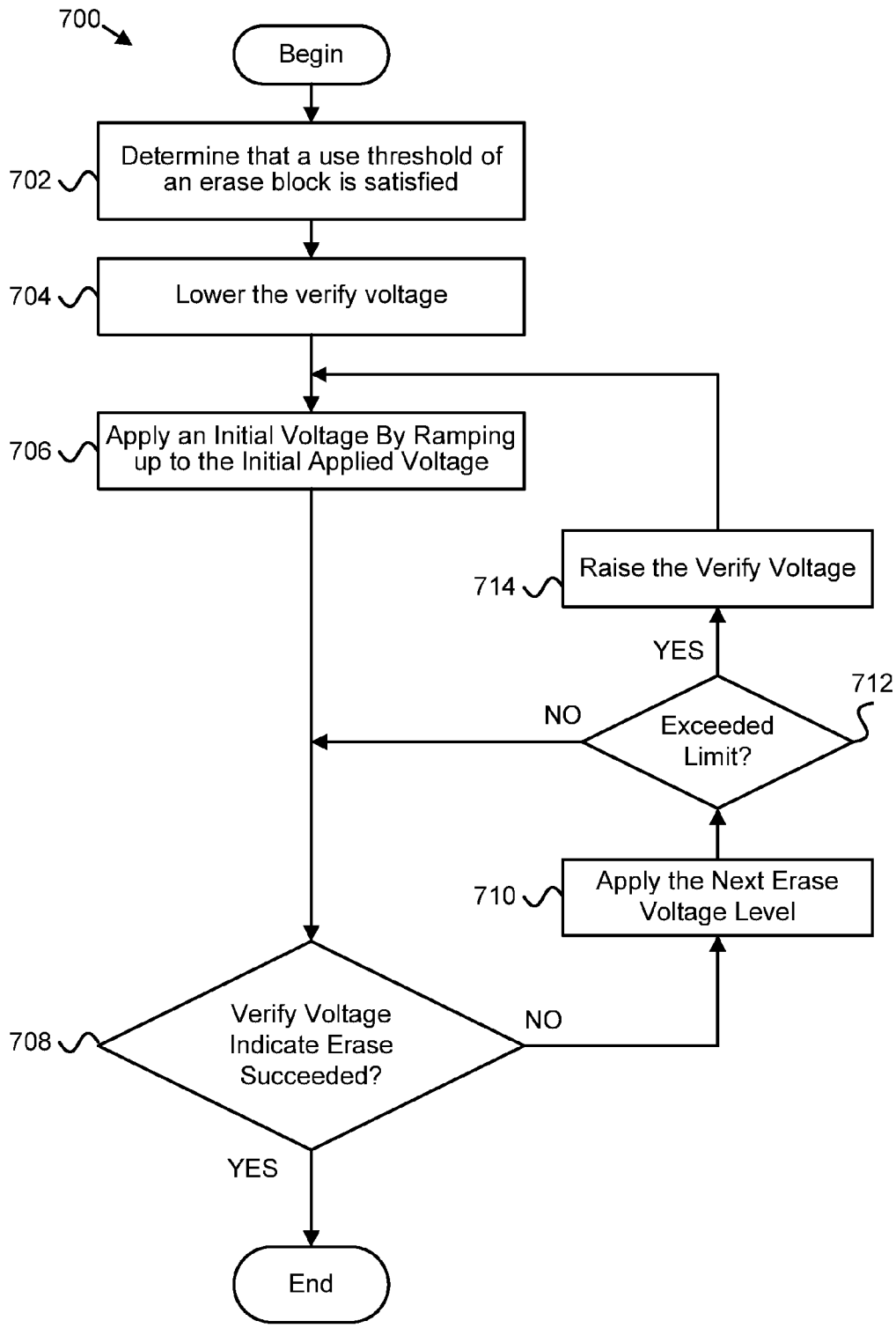
FIG. 7 is a schematic flow chart diagram illustrating one embodiment of a method for performing an extended erase on non-volatile storage cells.

FIG. 7 is a schematic flow chart diagram illustrating one embodiment of a method for performing an extended erase on non-volatile storage cells. The method 700 begins and a status module 202 may determine 702 that a use threshold of an erase block is satisfied. An adjustment module 204 may lower 704 the verify voltage. An erase module 206 may apply 706 an initial voltage by ramping up to the initial erase voltage level. The erase module 206 may then determine 708 if the erase block had successfully erased. If it had, then the method may end.

If not, the erase module 206 may apply 710 the next erase voltage level. The erase module 206 may determine if either a peak voltage level is exceeded or a step limit is exceeded. If no, then the erase module 206 may again determine 712 if the erase block had successfully erased. If yes, the erase module 206 or the adjustment module 204 may raise 714 the verify voltage level, and the method may continue at block 706 as before.

A means for determining whether a degradation threshold for one or more non-volatile storage cells is satisfied, in various embodiments, may include a status module 202, a periodic erase module 150, a non-volatile memory controller 124, other logic hardware, and/or other executable code stored on a computer readable storage medium. Other embodiments may include similar or equivalent means for determining whether a degradation threshold for one or more non-volatile storage cells is satisfied.

A means for performing a default erase operation for the one or more storage cells, in various embodiments, may include an erase module 206, a periodic erase module 150, a non-volatile memory controller 124, other logic hardware, and/or other executable code stored on a computer readable storage medium. Other embodiments may include similar or equivalent means for performing a default erase operation for the one or more storage cells.

A means for performing an extended erase operation for the one or more storage cells, in various embodiments, may include an erase module 206, a periodic erase module 150, a non-volatile memory controller 124, other logic hardware, and/or other executable code stored on a computer readable storage medium. Other embodiments may include similar or equivalent means for performing an extended erase operation for the one or more storage cells.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
    determining whether a use threshold for one or more non-volatile storage cells is satisfied;
    performing a default erase operation using a default erase voltage step size for the one or more storage cells in response to determining that the use threshold is not satisfied; and
    performing an extended erase operation using a smaller erase voltage step size than the default erase voltage step size for the one or more storage cells in response to determining that the use threshold is satisfied, such that the extended erase operation comprises a greater number of erase pulse iterations than the default erase operation.

2. The method of claim 1, further comprising adjusting values of one or more erase parameters for the extended erase operation from corresponding values for the default erase operation.

3. The method of claim 2, wherein the one or more erase parameters for the extended erase operation comprise the smaller erase voltage step size and one or more of an initial erase voltage level, a number of erase voltage level steps, an erase verify voltage level, and an erase pulse duration.

4. The method of claim 1, wherein performing the extended erase operation comprises lowering an erase verify voltage level for the extended erase operation from a default erase verify voltage level of the default erase operation.

5. The method of claim 1, wherein performing the extended erase operation comprises lowering an initial erase voltage level for the extended erase operation from a default initial erase voltage level of the default erase operation.

6. The method of claim 1, wherein the use threshold comprises one or more of a program/erase cycle count threshold, an error rate threshold, and an erase duration threshold for the one or more non-volatile storage cells.

7. The method of claim 1, wherein the extended erase comprises:
    lowering an erase verify voltage for the one or more storage cells from a default erase verify voltage of the default erase operation;

applying an initial erase voltage level to the one or more storage cells; and applying incrementally higher erase voltage levels to the one or more storage cells based on the smaller erase voltage step size.

8. The method of claim 7, wherein an erase pulse duration of the incrementally higher voltage levels is longer than an erase pulse duration of the default erase operation.

9. The method of claim 7, wherein the lowered erase verify voltage of the extended erase operation causes the incrementally higher erase voltage levels to reach a voltage level that is higher than a voltage level reached during the default erase operation.

10. The method of claim 7, wherein applying incrementally higher erase voltage levels completes before the lowered erase verify voltage is satisfied, the method further comprising:

raising the lowered erase verify voltage for the storage cell in response to applying the incrementally higher erase voltage levels; and applying another set of incrementally higher erase voltage levels to the one or more storage cells until the raised erase verify voltage is satisfied.

11. The method of claim 1, wherein the extended erase operation comprises:

applying an initial erase voltage to the one or more storage cells, the initial erase voltage being lower than an initial erase voltage for the default erase operation; and applying incrementally higher erase voltage levels until an erase verify voltage level is satisfied, wherein an erase voltage differential between the incrementally higher voltage levels comprises the smaller erase voltage step size.

12. The method of claim 11 wherein applying the initial erase voltage level comprises ramping up to the initial erase voltage level from a lower voltage level.

13. An apparatus comprising:

a status module configured to monitor a degradation threshold for a set of storage cells;

an adjustment module configured to lower an initial erase voltage level for the set of storage cells relative to a default initial erase voltage level in response to the status module determining that the degradation threshold is satisfied; and an erase module configured to perform an extended erase operation for the set of storage cells using a lowered initial erase voltage level in response to the status module determining that the degradation threshold is satisfied.

14. The apparatus of claim 13, wherein the degradation threshold comprises one or more of a program/erase cycle count threshold, an error rate threshold, and an erase duration threshold for the set of storage cells.

15. The apparatus of claim 13, wherein the erase module is further configured to ramp an erase voltage level up to the lowered initial erase voltage for the erase operation and to apply a plurality of increasing erase voltage levels to the set of storage cells until an erase verify voltage level is satisfied.

16. The apparatus of claim 13, wherein the adjustment module is configured to lower an erase verify voltage level from a default erase verify voltage level for the set of storage cells in response to the status module determining that the degradation threshold is satisfied.

17. A system comprising:

a non-volatile recording medium comprising a plurality of erase blocks;

a storage controller for the non-volatile recording medium, the storage controller comprising, a status module configured to determine a characteristic for each of the erase blocks;

an adjustment module configured to adjust initial erase voltage levels independently for different erase blocks; and an erase module configured to perform an extended erase operation for an erase block using an adjusted initial erase voltage level for the erase block from the adjustment module in response to the characteristic for the erase block satisfying a threshold.

18. The system of claim 17, wherein the storage controller is configured to concurrently perform a storage operation on another of the plurality of erase blocks while the erase module performs the extended erase operation on the erase block.

19. The system of claim 17, wherein the adjustment module is further configured to adjust one or more of an erase voltage level step size, a number of discrete erase voltage levels, an erase verify voltage level, and an erase pulse duration for the extended erase operation.

20. The system of claim 19, wherein the adjustment module is configured to store adjusted parameters for the extended erase operation in control registers for the non-volatile recording medium.

21. The system of claim 17, wherein the use threshold comprises one or more of a program/erase count, an error rate, and an erase duration for an erase block.

22. An apparatus comprising:

a status module that determines that a threshold of an erase block has been satisfied;

an adjustment module that adjusts one or more erase parameters for the erase block, the adjustments selected to recondition storage cells of the erase block; and an erase module that performs an extended erase operation for the erase block using the adjusted one or more erase parameters including an erase voltage step size lowered from a default erase voltage step size.

23. The apparatus of claim 22, wherein the threshold comprises one or more of a program/erase count threshold, an error rate threshold, and an erase duration threshold.

24. The apparatus of claim 22, wherein the adjusted one or more erase parameters comprise the lowered erase voltage step size and one or more of a lower initial erase voltage level, a longer erase pulse duration, and a lower erase verify voltage level, each relative to one or more erase parameters of a default erase operation.

25. An apparatus comprising:

means for determining whether a degradation threshold for one or more non-volatile storage cells is satisfied;

means for performing a default erase operation for the one or more storage cells in response to determining that the degradation threshold is not satisfied; and means for performing an extended erase operation for the one or more storage cells in response to determining that the degradation threshold is satisfied, the extended erase operation comprising a smaller voltage differential between erase steps than the default erase operation.

* * * * *